United States Patent
Lai et al.

(10) Patent No.: US 6,646,881 B1
(45) Date of Patent: Nov. 11, 2003

(54) MOUNTING ASSEMBLY FOR HEAT SINK

(75) Inventors: Cheng-Tien Lai, Tu-chen (TW); ShengHua Wang, Shenzhen (CN)

(73) Assignee: Hon Hai Precision Ind. Co., Ltd., Taiepi Hsien (TW)

( * ) Notice: Subject to any disclaimer, the term of this patent is extended or adjusted under 35 U.S.C. 154(b) by 0 days.

(21) Appl. No.: 10/301,974

(22) Filed: Nov. 21, 2002

(30) Foreign Application Priority Data

Jun. 6, 2002 (TW) .................................... 91208387 U

(51) Int. Cl.[7] ................................................ H05K 7/20
(52) U.S. Cl. ...................... 361/719; 257/719; 165/80.3; 24/458
(58) Field of Search ................................ 257/722, 718, 257/719, 726, 727; 24/453, 457, 458; 165/80, 3, 185; 174/16.3; 248/505, 510; 361/687, 703, 704, 705, 709–712, 717–719, 720; 29/890.03

(56) References Cited

U.S. PATENT DOCUMENTS 5,870,285 A * 2/1999 Kosteva et al. ............ 361/704
6,055,159 A * 4/2000 Sun ............................ 361/704
6,459,582 B1 * 10/2002 Ali et al. .................... 361/704

OTHER PUBLICATIONS

USPGPUB 2002/0181206 A1, Jun. 1, 2001, Isenburg.*

* cited by examiner

*Primary Examiner*—Gerald Tolin
(74) *Attorney, Agent, or Firm*—Wei Te Chung

(57) ABSTRACT

A mounting assembly for securing a heat sink (10) to an electronic package (50) mounted on a circuit board (40) includes a back plate (20), a clip (30), and two screws (70). The back plate abuts an underside of the circuit board. The back plate includes a cross-shaped main body (22), and two first positioning posts (24) and two second positioning posts (26). An annular groove (242) and a threaded hole (262) are defined in each first and each second positioning post respectively. The clip includes a horizontal portion (32), and two first legs (34) and two second legs (36). A guiding hole (342) and a communicating positioning slot (344) are defined in each first leg, the positioning slot engagingly receiving a corresponding first positioning post. A fastening slot (362) is defined in each second leg. The screws are inserted through the fastening slots into the corresponding threaded holes.

14 Claims, 2 Drawing Sheets

MOUNTING ASSEMBLY FOR HEAT SINK

BACKGROUND OF THE INVENTION

1. Field of the Invention

The present invention relates to a mounting assembly for mounting a heat sink to an electronic package mounted on a circuit board, and particularly to a mounting assembly which easily and securely mounts the heat sink to the electronic package.

2. The Related Art

A computer central processing unit (CPU) is the core administrator of electrical signals in most contemporary personal computers. Continued development of CPUs has enabled them to perform more and more functions. Heat generated by CPUs has increased commensurately. Measures must be taken to efficiently remove the heat from the CPU. Typically, a heat sink having great heat conductivity is mounted on the CPU to remove heat therefrom.

A conventional configuration for fastening a heat sink to a CPU comprises a plurality of barbs formed around a bottom of the heat sink. A plurality of protruding edges extends from a CPU connector that supports the CPU, for engaging with the barbs and thereby securing the heat sink to the CPU. However, this configuration necessitates unduly large force being applied to tightly press the heat sink onto the CPU. The CPU is liable to be damaged if excessively large force is applied during assembly, or if force is applied in an incorrect direction. Therefore assembly needs to be performed carefully and slowly. This is particularly inefficient in mass production facilities.

Accordingly, various clips have been developed for mounting a heat sink to a CPU. As shown in TW Patent No. 87221090, a conventional clip includes an H-shaped portion and four legs extending from four distal ends of the H-shaped portion respectively. A barb is formed at a distal end of each leg, for engaging in a corresponding hole around a CPU. However, this configuration may not apply sufficient force to securely fasten the heat sink on the surface of the CPU. In addition, the clip is prone to fatigue and deformation after prolonged use. Deformation further reduces the retaining force.

BRIEF SUMMARY OF THE INVENTION

Accordingly, an object of the present invention is to provide a mounting assembly which easily and securely mounts a heat sink to an electronic package mounted on a circuit board.

To achieve the above object, a mounting assembly in accordance with a preferred embodiment of the present invention comprises a back plate, a clip and two screws. The back plate comprises a cross-shaped main body, and a pair of first positioning posts and a pair of second positioning posts extending upwardly from the main body. An annular groove is defined in a top end of each first positioning post. A threaded hole is vertically defined in each second positioning post. The clip comprises a horizontal portion, and a pair of first legs and a pair of second legs extending from the horizontal portion. A guiding hole and a positioning slot communicating with the guiding hole are defined in a distal end of each first leg. A fastening slot is defined in a distal end of each second leg. An electronic package such as a CPU is mounted on a top side of a circuit board. The back plate abuts an underside of the circuit board, and the clip and a heat sink are disposed at the top side of a circuit board. The positioning slots of the clip engagingly receive the first positioning posts of the back plate. The screws are inserted through the fastening slots of the clip into the corresponding threaded holes of the second positioning posts of the back plate. The mounting assembly thus secures the heat sink to the CPU.

Other objects, advantages and novel features of the present invention will be drawn from the following detailed description of preferred embodiments of the present invention with the attached drawings, in which:

DETAILED DESCRIPTION OF THE INVENTION

Figure 1:
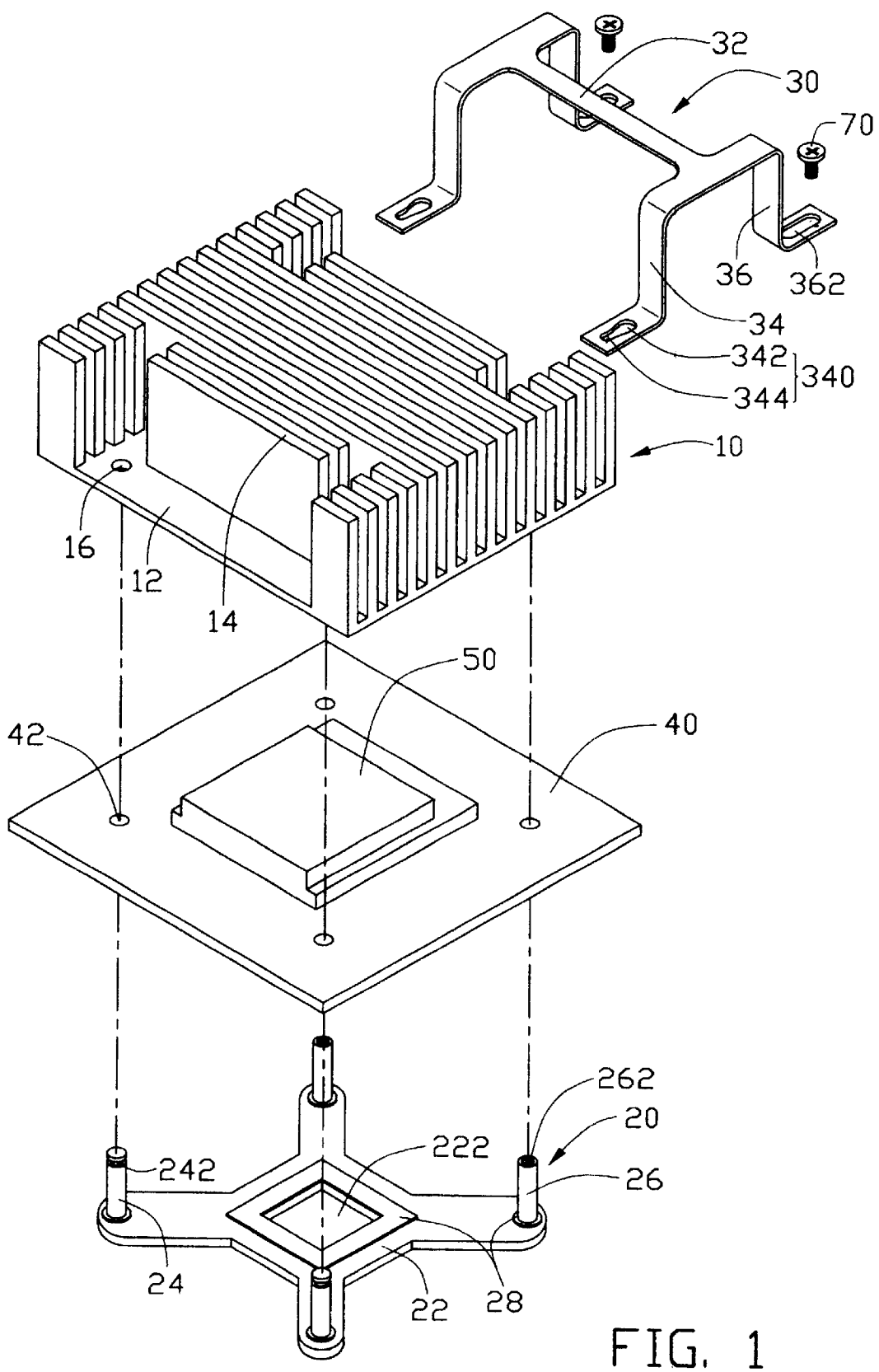
FIG. 1 is an exploded isometric view of a mounting assembly in accordance with a preferred embodiment of the present invention, together with a heat sink, and an electronic device mounted on a circuit board.

Referring to FIG. 1, a mounting assembly in accordance with a preferred embodiment of the present invention is used to attach a heat sink 10 to an electronic package 50 that is mounted on a circuit board 40. The mounting assembly comprises a back plate 20, a clip 30 and two screws 70. Four bores 42 are defined in the circuit board 40 around the electronic package 50.

The heat sink 10 includes a chassis 12, and a plurality of parallel fins 14 extending upwardly from the chassis 12. The chassis 12 defines four apertures 16, corresponding to the bores 42 of the circuit board 40.

The back plate 20 comprises a cross-shaped main body 22, a pair of first positioning posts 24 extending upwardly from two distal ends of the main body 22, and a pair of second positioning posts 26 extending upwardly from two other distal ends of the main body 22. Each first positioning post 24 is opposite from a second positioning post 26, and vice versa. A square opening 222 is defined in a center of the main body 22. An annular groove 242 is defined in a top end of each first positioning post 24. A threaded hole 262 is vertically defined in each second positioning post 26. Cushions 28 are provided on the main body 22 as follows: around the opening 222, at a bottom of each first positioning post 24, and at a bottom of each second positioning post 26. The cushions 28 protect the circuit board 40 in assembly. In addition, the cushions 28 are made of insulative material to insulate the circuit board 40 from the back plate 20.

The clip 30 comprises an H-shaped horizontal portion 32, a pair of L-shaped first legs 34 extending generally in a first direction from the horizontal portion 32, and a pair of L-shaped second legs 36 extending generally in a second direction from the horizontal portion 32, the second direction being opposite to the first direction. A positioning cutout 340 is defined in each first leg 34. Each positioning cutout 340 comprises a guiding hole 342, and a positioning slot 344 at a distal side of and in communication with the guiding hole 342. A diameter of the guiding hole 342 is slightly greater than a diameter of each first positioning post 24 of the back plate 20. A width of the positioning slot 344 is less than the diameter of each first positioning post 24, but greater than a diameter of each first positioning post 24 at the annular groove 242 thereof. A fastening slot 362 is defined in each second positioning leg 36. A width of the fastening slot 362 is greater than a diameter of the threaded hole 262 of each second positioning post 26, but less than a diameter of each second positioning post 26.

Figure 2:
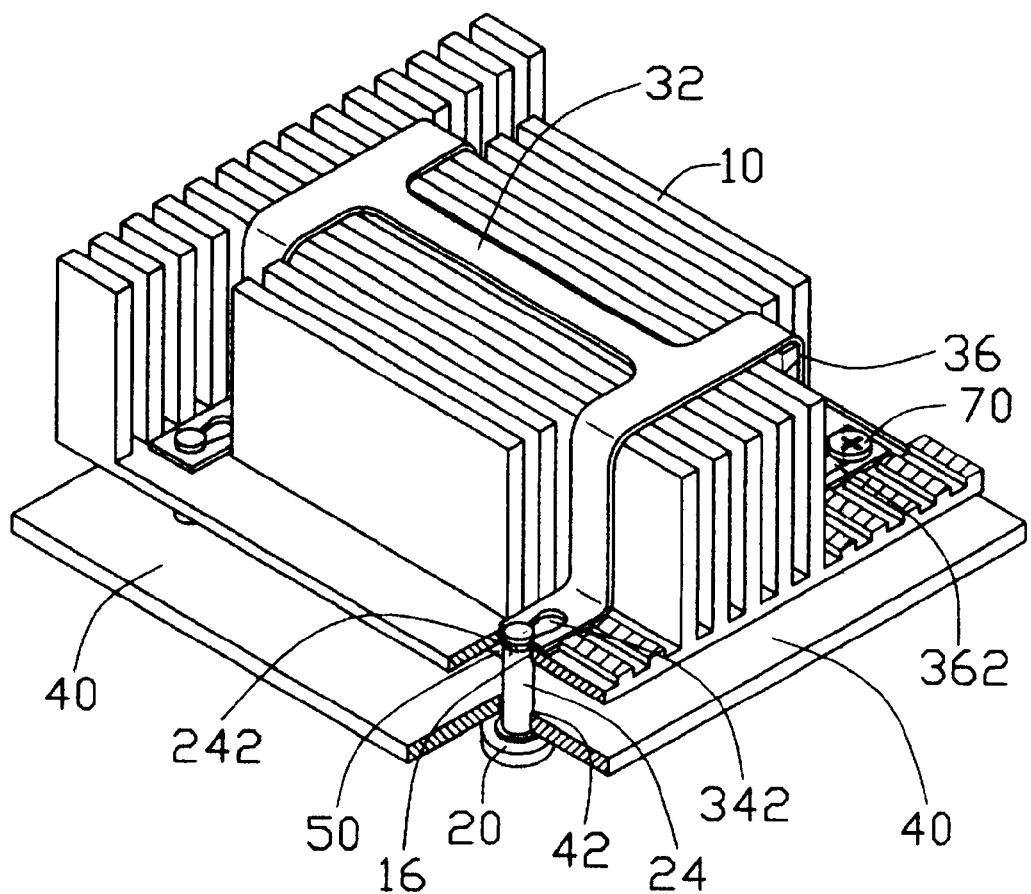
FIG. 2 is an assembled view of FIG. 1.

Referring also to FIG. 2, in assembly, the heat sink 10 is placed on a top surface of the electronic package 50. The first positioning posts 24 and second positioning posts 26 of the back plate 20 are sequentially inserted through the corresponding bores 42 of the circuit board 40 and the corresponding apertures 16 of the heat sink 10. Then the clip 30 is placed on the heat sink 10. The first positioning posts 24 are received through the guiding holes 342. Then the back plate is slid in the second direction, so that the first positioning posts 24 at the annular grooves 242 are engaged with the first legs 34 in the positioning slots 344. The screws 70 are inserted through the fastening slots 362 to engage in the threaded holes 262 of the second positioning posts 26. Thus the heat sink 10 is fastened to the circuit board 40. The H-shaped horizontal portion 32 firmly and evenly presses the heat sink 10 onto the top surface of the electronic package 50.

In an alternative embodiment of the present invention, the threaded holes 262 may instead be replaced by corresponding externally threaded portions of the second positioning posts 26. Accordingly, the screws 70 may be replaced by internally-threaded screw caps.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A mounting assembly for attaching a heat sink to an electronic package on a circuit board, the mounting assembly comprising:
   a back plate comprising a main body, a first post extending from the main body adapted for extending through the circuit board and the heat sink, and an opposite second post extending from the main body adapted for extending through the circuit board and the heat sink, the first post defining an annular groove in an upper portion thereof, the second post having a fastening portion;
   a clip comprising a main portion adapted for pressing the heat sink onto the electronic package, and first and second legs extending from the main portion, the first leg defining a guiding hole and a positioning slot in communication with the guiding hole, the second leg defining a fastening slot; and
   a fastening member engaging with the fastening portion of the back plate and sandwiching the second leg of the clip therebetween,
   wherein the first post of the back plate is extendable through the guiding hole to engage in the positioning slot of the clip.

2. The mounting assembly as claimed in claim 1, wherein the fastening portion of the back plate defines a threaded hole therein, and the fastening member is a screw extending through the fastening slot of the second leg to engage in the threaded hole.

3. The mounting assembly as claimed in claim 1, wherein the fastening portion of the back plate comprises an external thread, and the fastening member is a screw cap, the external thread extending through the fastening slot of the second leg to engage with the screw cap.

4. The mounting assembly as claimed in claim 1, wherein a diameter of the guiding hole of the first leg of the clip is greater than a width of the positioning slot.

5. The mounting assembly as claimed in claim 1, wherein an opening is defined in a central portion of the main body of the back plate.

6. The mounting assembly as claimed in claim 5, wherein cushions are provided around the opening of the main body, a bottom of the first post and a bottom of the second post, for protecting the circuit board from damage.

7. The mounting assembly as claimed in claim 6, wherein the cushions are made of insulating material, for insulating the circuit board from the back plate.

8. The mounting assembly as claimed in claim 1, wherein the main body of the back plate is cross-shaped.

9. The mounting assembly as claimed in claim 1, wherein the main portion of the clip is generally H-shaped.

10. A method for attaching a heat sink to an electronic package on a circuit board, the circuit board defining a plurality of apertures therein; the method comprising:
    a) providing a back plate having a main body, a first post, and a second post having a fastening portion;
    b) providing a heat sink, the heat sink comprising a base and a plurality of fins extending from the base, the base defining a plurality of holes therein;
    c) providing a clip having a first leg defining a guiding hole and a locking means, and a second leg defining a fastening slot;
    d) placing the heat sink on the electronic package such that the holes thereof are aligned with the apertures, respectively;
    e) attaching the back plate to an underside of the circuit board, the first post and the second post of the back plate each sequentially inserting through the apertures of the circuit board and the holes of the heat sink;
    f) placing the clip over the heat sink and causing the first post of the back plate to be received in the guiding hole of the clip;
    g) moving the clip laterally until the first post is engaged with the locking means of the clip; and
    h) engaging a fastening member with the fastening portion of the second post thereby sandwiching the second leg therebetween.

11. The method as claimed in claim 10, wherein the fastening portion of the back plate defines a threaded hole therein, and the fastening member is a screw extending through the fastening slot of the second leg to engage in the threaded hole.

12. The method as claimed in claim 10, wherein the fastening portion of the back plate comprises an external thread, and the fastening member is a screw cap, the external thread extending through the fastening slot of the second leg to engaging with the screw cap.

13. The method as claimed in claim 10, wherein the locking means of the clip is a slot communicating with the guiding hole.

14. A mounting assembly comprising:
    a printed circuit board defining a plurality of first through holes;
    an electronic package located on the printed circuit board;
    a heat sink seated upon the electronic package with a plurality of second through holes in alignment with the first through holes, respectively;
    a back plate located on an underside of the printed circuit board with a plurality of first and second positioning posts extending upwardly through the corresponding first and second through holes, respectively;
    a clip including a main portion pressing downwardly against the heat sink, said clip further including first and second sets of holes of which, the first set defines configurations allowing the first positioning posts to freely extend upwardly therethrough and to successively relatively move horizontally to be restrained from withdrawal, and the second set defines configurations allowing fasteners to extend therethrough to fasten to the corresponding second positioning posts, respectively, wherein said fasteners press against the clip to have the clip in a tension manner for tightly combining the heat sink the electronic package thereunder, and to prevent the clip from upwardly moving away from the heat sink.

* * * * *